(12) United States Patent
Bijnen et al.

(10) Patent No.: US 10,514,620 B2
(45) Date of Patent: Dec. 24, 2019

(54) ALIGNMENT METHOD

(71) Applicants: ASML NETHERLANDS B.V., Veldhoven (NL); ASML HOLDING N.V., Veldhoven (NL)

(72) Inventors: Franciscus Godefridus Casper Bijnen, Valkenswaard (NL); Simon Gijsbert Josephus Mathijssen, Rosmalen (NL); Vassili Demergis, Norwalk, CT (US); Edo Maria Hulsebos, Waalre (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/315,100

(22) PCT Filed: Aug. 14, 2017

(86) PCT No.: PCT/EP2017/070537
§ 371 (c)(1),
(2) Date: Jan. 3, 2019

(87) PCT Pub. No.: WO2018/033499
PCT Pub. Date: Feb. 22, 2018

(65) Prior Publication Data
US 2019/0227446 A1    Jul. 25, 2019

Related U.S. Application Data

(60) Provisional application No. 62/375,263, filed on Aug. 15, 2016.

(51) Int. Cl.
*G03F 9/00* (2006.01)

(52) U.S. Cl.
CPC .......... *G03F 9/7092* (2013.01); *G03F 9/7019* (2013.01); *G03F 9/7046* (2013.01); *G03F 9/7069* (2013.01); *G03F 9/7076* (2013.01)

(58) Field of Classification Search
None
See application file for complete search history.

(56) References Cited

U.S. PATENT DOCUMENTS 6,297,876 B1   10/2001  Bornebroek
6,486,954 B1   11/2002  Mieher et al.
(Continued)

OTHER PUBLICATIONS

International Search Report and Written Opinion issued in corresponding PCT Patent Application No. PCT/EP2017/070537, dated Nov. 8, 2017.

*Primary Examiner* — Michelle M Iacoletti
(74) *Attorney, Agent, or Firm* — Pillsbury Winthrop Shaw Pittman LLP

(57) ABSTRACT

A method of determining the position of an alignment mark on a substrate, the alignment mark having first and second segment, the method including illuminating the alignment mark with radiation, detecting radiation diffracted by the alignment mark and generating a resulting alignment signal. The alignment signal has a first component received during illumination of the first segment only, a second component received during illumination of the second segment only, and a third component received during simultaneous illumination of both segments. The positions of the segments are determined using the first component, the second component and the third component of the alignment signal.

20 Claims, 14 Drawing Sheets

(56) References Cited

U.S. PATENT DOCUMENTS

| | | |
|---|---|---|
| 6,961,116 B2 | 11/2005 | Den Boef et al. |
| 7,672,000 B2 * | 3/2010 | Hayashi .............. G03F 7/70691 356/401 |
| 2004/0179184 A1 | 9/2004 | Levasier et al. |

* cited by examiner

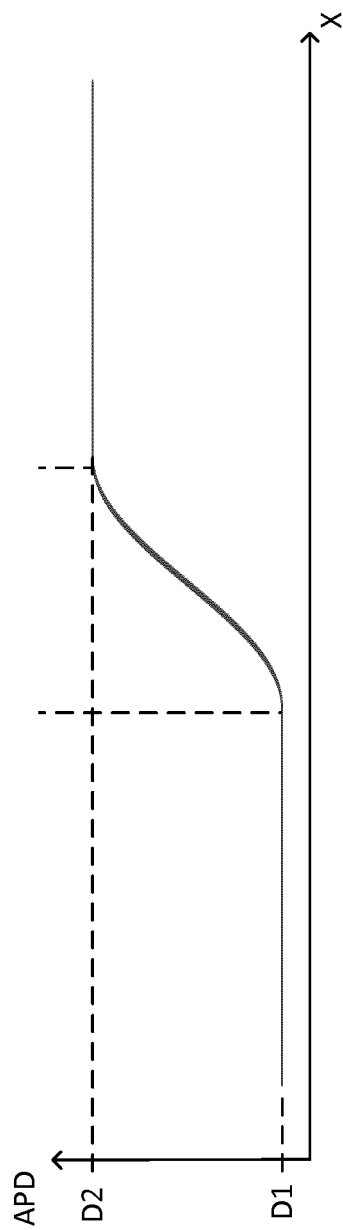

ALIGNMENT METHOD

CROSS REFERENCE TO RELATED APPLICATIONS

This application is the U.S. national phase entry of PCT patent application no. PCT/EP2017/070537, which was filed on Aug. 14, 2017, which claims the benefit of priority of U.S. provisional application no. 62/375,263, which was filed on Aug. 15, 2016, and which is incorporated herein in its entirety by reference.

FIELD

The present invention relates to an alignment method, and also relates to an alignment system. The alignment system may form part of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to accurately apply a desired pattern onto the substrate, alignment marks are provided on the substrate, and the lithographic apparatus is provided with an alignment system. The alignment system is configured to perform measurements and determine the positions of the alignment marks provided on the substrate therefrom.

It is desirable to reduce the size of the alignment marks so that more space on the substrate is available for applying a desired pattern onto the substrate. Reducing the size of the alignment marks may reduce the reproducibility and/or the accuracy of measurements made using the alignment system. It is desirable to provide an alignment method that allows the size of the alignment marks to be reduced without affecting the reproducibility and/or the accuracy of measurements made using the alignment system. Alternatively, it may be desirable to maintain the size of the alignment marks and improve the reproducibility and/or the accuracy of measurements made using the alignment system.

SUMMARY

According to a first aspect of the invention, there is provided a method of determining the position of an alignment mark on a substrate, the alignment mark comprising a first segment and a second segment, the method comprising illuminating the alignment mark with radiation, detecting radiation diffracted by the alignment mark and generating a resulting alignment signal, the alignment signal comprising a first component received during illumination of the first segment only, a second component received during illumination of the second segment only, and a third component received during simultaneous illumination of both segments; and determining the positions of the segments using the first component, the second component and the third component of the alignment signal.

This method makes efficient use of an alignment signal that includes a third component received during illumination of two alignment segments. This method allows the size of the alignment mark to be reduced, thus allowing more space for printing desired patterns on the substrate, without affecting the accuracy and/or the reproducibility of measurements made using the alignment system. Alternatively, the method may enable a distance between the alignment segments to be removed and the length of the alignment segments to be reduced such that the total size of the alignment mark is significantly reduced without having an unacceptably large impact on the reproducibility and/or the accuracy of measurements. Alternatively, the method may enable the size of alignment segments to be maintained whilst improving the reproducibility and/or the accuracy of measurements made using the alignment mark.

The determining may include using the results of a calibration measurement on a calibration mark having known characteristics to produce a calibration alignment signal from which a relationship between the alignment signal and the positions of the segments may be determined.

Performing a calibration measurement provides a simple way of determining the relationship between the alignment signal and the positions of the segments that does not require analytical expressions to be formulated and solved. A single calibration alignment signal may be fitted to multiple different alignment signals or multiple calibration measurements may be performed for different types of alignment mark if desired. A calibration measurement may be performed and its results may be stored for future use.

The determining may include fitting the calibration alignment signal to the alignment signal.

Fitting the calibration alignment signal to an alignment signal is a computationally quick and relatively simple way of determining the positions of the segments.

The determining may include deconvolving the third component of the alignment signal.

The deconvolution may be based upon knowledge of a size and shape of a profile of the radiation and knowledge of the first and second components.

The deconvolution may include fitting one or more functions to the alignment signal.

The calibration alignment signal may be used to deconvolve the third component of the alignment signal.

Using a calibration measurement to deconvolve the third component of the alignment signal (e.g. by determining the form of the one or more functions) may be quicker and simpler than constructing analytical expressions that may be used to deconvolve the third component.

The one or more functions may be a sine function and/or a cosine function.

Sine functions and cosine functions are a convenient way of representing and analyzing periodically varying signals, such as an alignment signal.

The determining may involve separating the alignment signal into multiple parts and analyzing each part to extract local phase information from the alignment signal.

Results of the analysis of each part of the alignment signal may be combined to produce a variation of the phase of the alignment signal as a function of the position of the radiation, the variation of the phase of the alignment signal being used in determining the positions of the segments.

Each part may be distinct and consist of an integer number of periods of the alignment signal, and analyzing each part of the alignment signal may include performing a fast Fourier transform on each part of the alignment signal.

The fast Fourier transform is a computationally quick method of analyzing the alignment signal.

Analyzing each part of the alignment signal may include fitting one or more functions to each part of the alignment signal.

The calibration alignment signal may be used to determine the form of the one or more functions.

The one or more functions may be a sine function and/or a cosine function.

Analyzing each part of the alignment signal may further include separating the one or more fitted functions into multiple parts and performing windowing analysis on the parts.

Windowing analysis is a well-established signal analysis technique that may be applied to the alignment signal with relative ease. Different window functions may be selected for different alignment signals, allowing flexibility in determining the positions of the segments.

The calibration alignment signal may be used to determine the form of the one or more functions.

The parts may overlap and analyzing each part may include performing non-rectangular windowing analysis on the parts.

Using non-rectangular windowing analysis allows greater flexibility in how the alignment signal is separated.

The determining may include performing a Hilbert transform on the alignment signal to produce a complex alignment signal.

Performing a Hilbert transform may advantageously take less time to computationally calculate the positions of the segments than other methods. The Hilbert transform approach may be robust against measurement disturbances such as low strength alignment signals and/or substrate processing effects.

Local alignment signal phase information may be extracted from the Hilbert transform of the alignment signal by determining the argument of the complex alignment signal.

The alignment signal may comprise a mixture of narrowband alignment signal contributions and a band pass filter may be used to separate the alignment signal contributions before the Hilbert transform is performed on the alignment signal contributions.

The length of a segment may depend upon a diameter of a radiation beam profile that is used to measure the segment. The length of a segment may be in the range of 40 micrometers or more. The length of a segment may be 200 micrometers or less. For example, the length of a segment may be in the range of 40-80 micrometers.

The ability to perform accurate and reproducible alignment position measurements without taking up a large amount of substrate space is very advantageous in lithographic applications because more space is available on the substrate for printing a desired pattern.

The segments may comprise periodic structures having the same pitch and the same orientation.

The first segment may comprise a sub-segmented grating having a first known component of positional offset between a center of its at-resolution features and a center of its space regions and the second segment may comprise a sub-segmented grating having a second known component of positional offset between a center of its at-resolution features and a center of its space regions, the first known component of positional offset being different to the second known component of positional offset.

Sub-segmented alignment marks provide the advantage of behaving similarly to product features when exposed to radiation. Subsequently exposed dies that include product features having a similar resolution and/or density on the substrate to the sub-segmented alignment marks present on the substrate may be better aligned to their intended positions as a result of using the sub-segmented alignment marks to align the product features on the substrate. The ability to reduce the size of sub-segmented alignment marks without compromising the accuracy of measurements made using the sub-segmented alignment marks is beneficial.

The substrate may comprise first and second target portions, and the first segment may be located in the first target portion and the second segment may be located in the second target portion such that the alignment mark is a concatenated intrafield alignment mark.

Intrafield alignment mark measurements may be made more efficient by allowing smaller intrafield alignment marks without affecting the accuracy and reproducibility of such measurements. Use of small concatenated alignment marks advantageously allows intrafield alignment mark measurements to be performed in less time and may enable a greater throughput of devices made using a lithographic apparatus.

The radiation may comprise multiple polarizations and/or multiple wavelengths.

Performing position measurements of alignment marks using radiation beams having different wavelengths or different polarizations advantageously allows different properties of the alignment marks to be measured and/or accounted for, e.g. different substrate layer structures may interact with radiation beams having different wavelengths or different polarizations differently.

According to a second aspect of the invention, there is provided a lithographic apparatus comprising a substrate table for holding a substrate, a projection system for projecting a patterned radiation beam onto a target portion of a substrate held by the substrate table, and an alignment system configured to perform the method of the first aspect of the invention or any of its associated options.

According to a third aspect of the invention, there is provided an alignment system comprising a radiation source, a detector and a processor, the processor being configured to receive an alignment signal from the detector, the alignment signal comprising a first component received during illumination of a first alignment mark segment only, a second component received during illumination of a second alignment mark segment only, and a third component received during simultaneous illumination of both alignment mark segments, and determine the positions of the alignment mark segments using the first component, the second component and the third component of the alignment signal.

According to a fourth aspect of the invention, there is provided a processor configured to receive an alignment signal, the alignment signal comprising a first component received during illumination of a first alignment mark segment only, a second component received during illumination of a second alignment mark segment only, and a third component received during simultaneous illumination of both alignment mark segments, and determine the positions of the alignment mark segments using the first component, the second component and the third component of the alignment signal.

According to a fifth aspect of the invention, there is provided a computer readable medium for storing computer readable code wherein the code causes a lithographic apparatus to perform the method of the first aspect of the invention or any of its associated options.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5a-5c consist of FIG. 5a to FIG. 5c, schematically depicts a radiation beam profile travelling across an alignment mark and signals resulting therefrom according to an embodiment of the invention;

DETAILED DESCRIPTION

Figure 1:
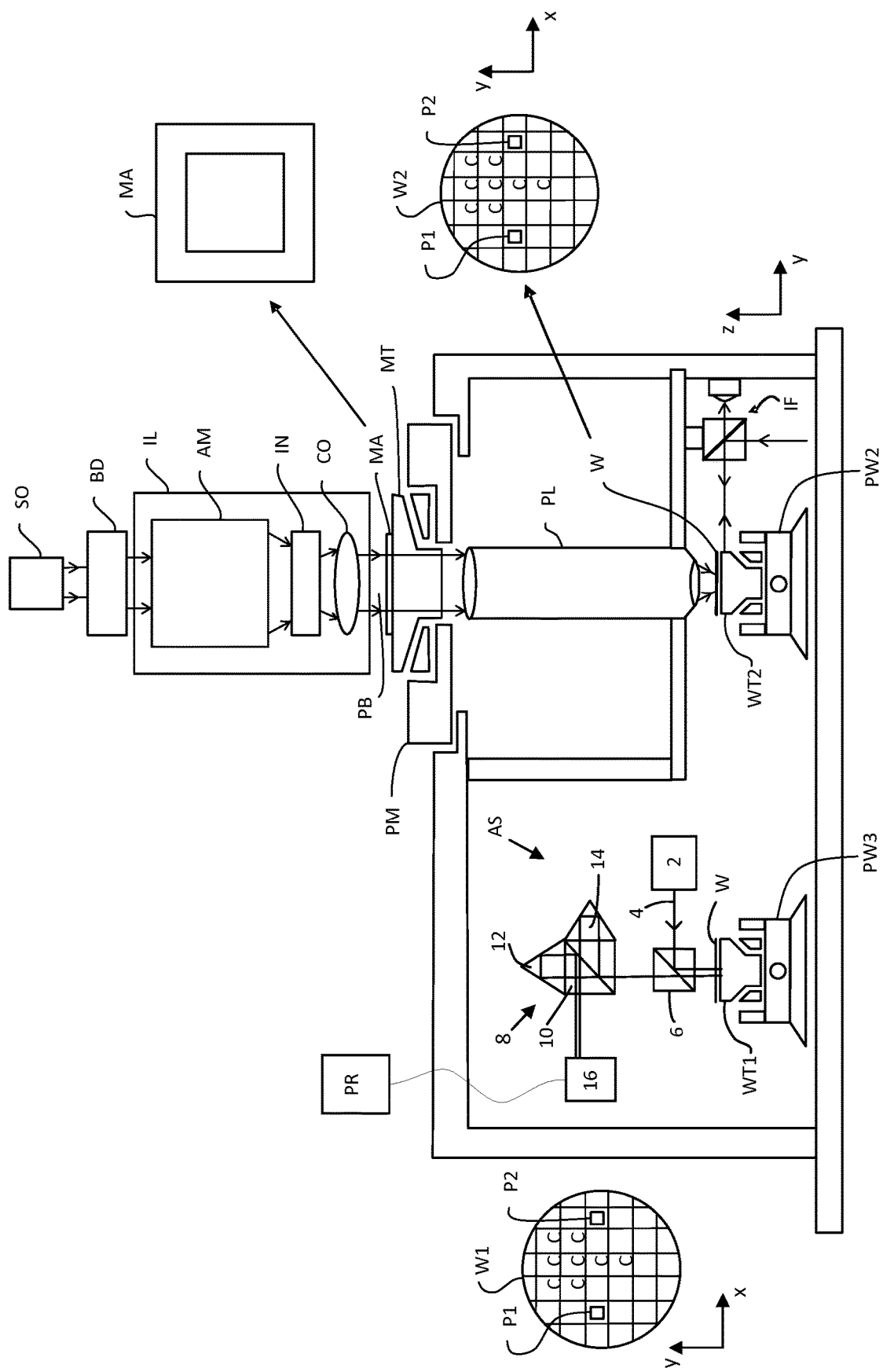
FIG. 1 schematically depicts a lithographic apparatus and an alignment system according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system IL to condition a beam PB of radiation (e.g. DUV radiation or EUV radiation).

a support structure (which may be referred to as a mask table) MT to support a patterning device (e.g. a mask) MA and connected to first positioning device PM to accurately position the patterning device with respect to item PL;

a substrate table (which may be referred to as a wafer table) WT2 for holding a substrate (e.g. a resist coated wafer) W2 and connected to second positioning device PW2 for accurately positioning the substrate with respect to item PL;

another substrate table WT1 for holding a substrate W1 and connected to third positioning device PW3 for accurately positioning the substrate with respect to item AS; and a projection system (e.g. a refractive projection lens) PL configured to image a pattern imparted to the radiation beam PB by patterning device MA onto a target portion C (e.g. comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W2. With the aid of the second positioning device PW2 and position sensor IF (e.g. an interferometric device), the substrate table WT2 can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed.

The lithographic apparatus may for example move the patterning device MA and the substrate W2 with a scanning motion when projecting the pattern from the patterning device onto a target portion C. Cartesian coordinates are indicated in FIG. 1. As is conventional, the z-direction corresponds with an optical axis of the radiation beam PB. In an embodiment in which the lithographic apparatus is a scanning lithographic apparatus, the y-direction corresponds with the direction of scanning motion.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned radiation onto the substrate as described above).

In the dual stage lithographic apparatus depicted in FIG. 1 an alignment system AS is provided on the left-hand side of the figure and the projection system PL is provided on the right-hand side of the figure. The alignment system AS measures the positions of alignment marks provided on a substrate W1 (schematically depicted by boxes P1, P2) which is held on a first substrate table WT1. A pattern is simultaneously projected by the projection system PL onto a substrate W held on a second substrate table WT2. When measurement of the substrate W1 supported by the first substrate table WT1 is completed and exposure of the substrate W2 supported by the second substrate table WT2 is completed, the positions of the substrate tables are swapped over. The substrate W1 supported by the first substrate table WT1 is then exposed using patterned radiation projected by the projection system PL. The already exposed wafer W2 supported by the second substrate table WT2 is removed from the substrate table for subsequent processing. Another substrate is then placed on the second substrate table WT2 for measurement by the alignment system AS prior to exposure using patterned radiation projected by the projection system PL.

Other measurement systems may be provided in addition to the alignment system AS used to measure the position of alignment marks on the substrates W1, W2. For example, a system which measures the topology of the surface of the substrate may be provided (this may be referred to as a level sensor). An interferometer (not depicted) and/or other position measurement means may be used to monitor the position of the substrate table WT1 during alignment measurements. A processor PR may receive data from the alignment system AS and also receive substrate table WT1 position information. The processor PR may be configured to perform any of the methods according to any embodiment of the invention described herein. Since the substrate W is fixed on the substrate table WT1, position information relating to the substrate table may be taken as being position information relating to the substrate.

The alignment system AS comprises a radiation source 2 configured to provide a beam of radiation 4 which will be used to illuminate an alignment mark P1, P2. The radiation source 2 is hereinafter referred to as alignment radiation beam source 2. The alignment radiation beam 4 passes from the alignment radiation beam source 2 to optics which direct the alignment radiation beam onto the substrate W1. The optics may comprise a beam splitter 6 (e.g. a polarizing beam splitter) and may comprise other additional components which are not depicted in FIG. 1. The alignment radiation beam 4 illuminates an alignment mark P1, P2 on the substrate W1, is reflected and passes through the beam splitter 6 to a self-referencing optical system 8. The alignment marks P1, P2 are provided in the form of segments, as explained further below.

The self-referencing optical system 8 comprises a polarizing beam splitter 10, a first corner cube reflector 12 and a second corner cube reflector 14. The alignment radiation 4 has a polarization such that, when it is received at the self-referencing optical system, the polarizing beam splitter 10 transmits half of the alignment radiation beam and reflects the other half of the alignment radiation beam. The portion of the alignment radiation beam 4 which is transmitted by the polarizing beam splitter 10 is reflected by the first corner cube reflector 12 and passes back to the polarizing beam splitter. The reflection by the first corner cube reflector 12 causes a rotation by 90° of the polarization of the alignment beam. Since the polarization of the radiation has been rotated by 90°, it is reflected by the polarizing beam splitter 10 towards a detector 16.

The portion of the alignment radiation beam 4 which is reflected by the polarizing beam splitter 10 passes to the second corner cube reflector 14 and is reflected by the second corner cube reflector. The reflection by the second corner cube reflector 14 causes a rotation by 90° of the polarization of the alignment radiation beam. Since the polarization of the reflected beam has been rotated by 90°, it passes through the polarizing beam splitter 10 and is incident upon the detector 16. The processor PR processes an alignment signal produced by the detector 16. The processor PR may be configured to perform any of the methods according to any embodiment of the invention described herein.

Further details of the alignment system AS described above (which may be known as a Smart Alignment Sensor Hybrid, or SMASH) may be found in U.S. Pat. No. 6,961,116. It is to be understood that the present invention is not limited to use with the example alignment system AS and alignment marks P1, P2 described above. Other alignment systems and/or alignment marks may be used. For example, an alignment signal may be produced by way of an alignment system of the type described in U.S. Pat. No. 6,297,876 (otherwise known as Advanced Technology using High order Enhancement of Alignment, or ATHENA). As a further example, an alignment system that utilizes the well-known "Through The Lens (TTL)" alignment technique in which radiation diffracted by an alignment mark is formed on a detector grating to produce a periodic alignment signal which may be used with the present invention. It will be apparent to the skilled person that other (optical) arrangements may be used to obtain the same result of illuminating an alignment mark on a substrate, detecting resulting radiation and producing an alignment signal therefrom.

It may be desirable to reduce the size of the alignment marks and/or reduce a spatial separation between the alignment marks so that more space on the substrate is available for applying a desired pattern onto the substrate. Embodiments of the invention allow this to be achieved whilst retaining alignment accuracy.

Figure 2A:
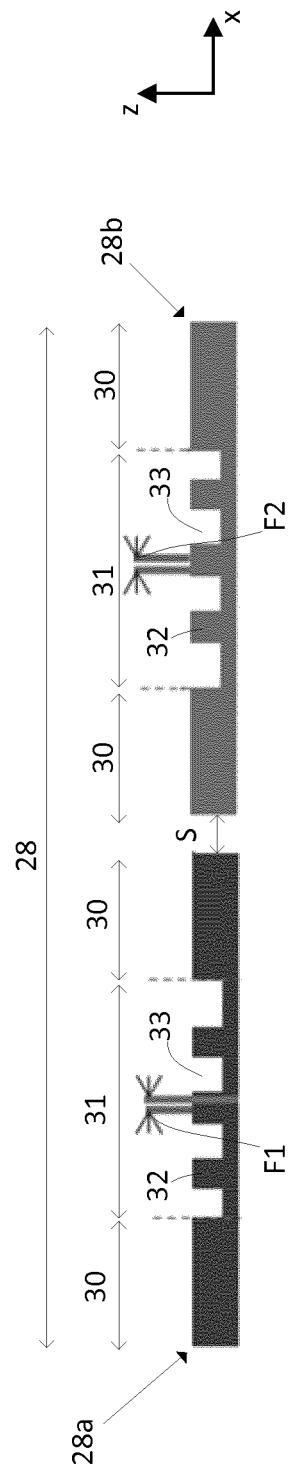
FIGS. 2a-2d consist of FIG. 2a to FIG. 2d, schematically depicts alignment marks according to an embodiment of the invention.
Figure 2B:
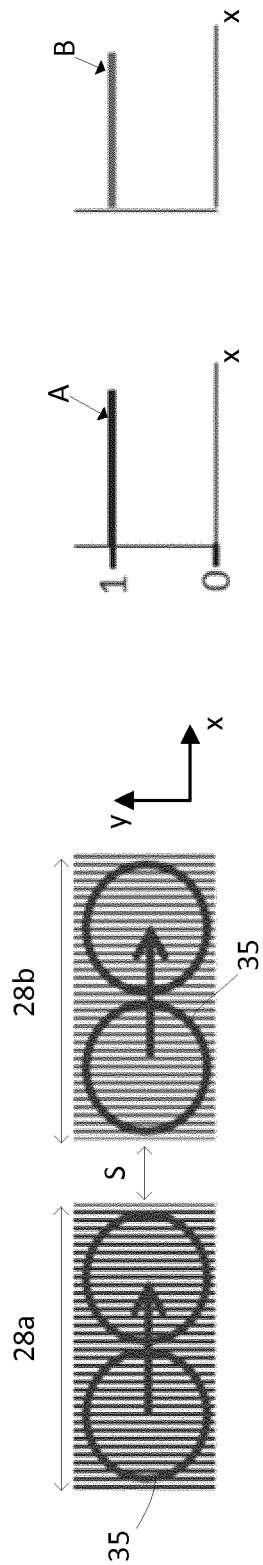

FIGS. 2a and 2b schematically depict two alignment marks 28a, 28b. Each alignment mark 28a, 28b is arranged in a periodic pattern whose repeating unit comprises "material" regions 30 and "space" regions 31. The repeating unit of a "material" region 30 and a "space" region 31 may be referred to as a structure. The structures are arranged periodically in at least a first direction. Each "material" region 30 of the alignment mark 28a, 28b may be formed such that the material 30 is not uniformly present, but is absent in a fine-pitch grating pattern comprising finer material regions and finer space regions. Alternatively, as depicted, each "space" region 31 of the alignment mark 28a, 28b may be formed such that the material 30 is not uniformly absent, but is present in a fine-pitch grating pattern comprising finer material regions 32 and finer space regions 33. These finer material regions 32 and finer space regions 33 are what is referred to herein as the "at-resolution" features, being at or close to the limit of resolution of the projection system in the lithographic apparatus that will use them. The finer material regions 32 may also be referred to as "sub-resolution" features because the alignment system AS shown in FIG. 1 may not have the resolution necessary to resolve these features. A finer material region 32 followed by a finer space region 33 may be referred to as a sub-structure. The sub-structures may also be periodic, and have a smaller period than the structures.

The alignment marks 28a, 28b may be referred to as sub-segmented alignment marks due to the presence of their structures and sub-structures. The sub-structures of the sub-segmented alignment marks 28a, 28b are of a similar period to product features, i.e. features that are to be printed onto the substrate using a lithographic apparatus during a production exposure. Sub-segmented alignment marks 28a, 28b therefore provide the advantage of behaving similarly to product features when exposed to radiation. Subsequently exposed dies that include product features having a similar resolution and/or density on the substrate to the sub-segmented alignment marks 28a, 28b present on the substrate may be better aligned to their intended positions as a result of using the sub-segmented alignment marks to align the product features on the substrate.

The sub-segmented alignment marks 28a, 28b are designed to have known components of positional offsets F1, F2 between a center of their at-resolution features and a center of their space regions 31. A first alignment mark 28a has a known component of positional offset F1 which is different from the known component of positional offset F2 applied in the second alignment mark 28b. It may be preferable to choose the known components of positional offsets F1, F2 to be positive and negative values of equal magnitudes so as to balance the known component of positional offset F1, F2 either side of zero (that is, F1=−F2). However, known components of positional offsets F1, F2 that are both in the same direction and/or have unequal magnitudes may be used.

FIG. 2b schematically depicts a radiation beam profile 35 travelling across first and second alignment marks 28a, 28b along with two corresponding graphs A, B. The graphs A, B indicate the area of the radiation beam profile 35 that is within the first and second alignment marks 28a, 28b respectively as the radiation beam profile 35 scans across the alignment marks 28a, 28b. A value of 1 on the vertical axis of the graphs A, B indicates that the entire area of the radiation beam profile 35 is within either alignment mark 28a or alignment mark 28b respectively. The radiation beam profile 35 is shown as having a circular shape. However, the radiation beam profile 35 may have any shape or size. For example, the radiation beam profile 35 may have a square shape, or an elliptical shape. The alignment marks 28a, 28b may, for example, have lengths of 80 micrometers each in the x direction. In this example, the alignment marks 28a, 28b are separated by a distance S. When the radiation beam profile 35 travels across the first alignment mark 28a the alignment signal comprises a first component that is indicative of the first alignment mark 28a (as shown by graph A). When the radiation beam profile 35 travels across the second alignment mark 28b the alignment signal comprises a second component that is indicative of the second alignment mark 28b (as shown by graph B). When the radiation beam profile 35 travels the distance S between the two alignment marks 28a, 28b the alignment signal comprises a third component that originates from both the first alignment mark 28a and the second alignment mark 28b. In known alignment methods the third component is discarded and the position of the first alignment mark 28a is determined using the first component A only and the position of the second alignment mark 28b is determined using the second component B only.

The reproducibility and/or the accuracy of position measurements made using the alignment marks 28a, 28b depends upon the pitch of the alignment marks and the length of the alignment marks. It is desirable to provide an alignment method that allows the total size of the alignment marks 28a, 28b to be reduced without affecting the reproducibility and/or the accuracy of measurements made using the alignment system AS. Alternatively, it may be desirable to maintain the size of the alignment marks 28a, 28b and improve the reproducibility and/or the accuracy of measurements made using the alignment system. Using the third component of the alignment signal when determining the positions of the alignment marks 28a, 28b may enable the distance S between the alignment marks 28a, 28b to be reduced or removed and/or enable the length of the alignment marks 28a, 28b to be reduced without affecting the reproducibility and/or the accuracy of measurements made using the alignment system AS. Using the third component of the alignment signal when determining the positions of the alignment marks 28a, 28b may enable the distance S between the alignment marks 28a, 28b to be removed and the length of the alignment marks 28a, 28b to be reduced such that the total size of the alignment marks 28a, 28b is significantly reduced without having an unacceptably large impact on the reproducibility and/or the accuracy of measurements made using the alignment system AS. Using the third component of the alignment signal when determining the positions of the alignment marks 28a, 28b may enable the size of the alignment marks 28a, 28b to be maintained whilst improving the reproducibility and/or the accuracy of measurements made using the alignment system AS.

Figure 2C:
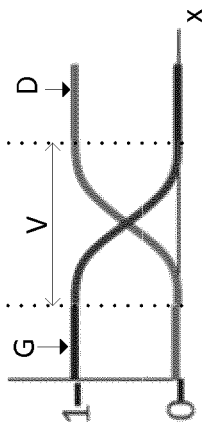
Figure 2C:
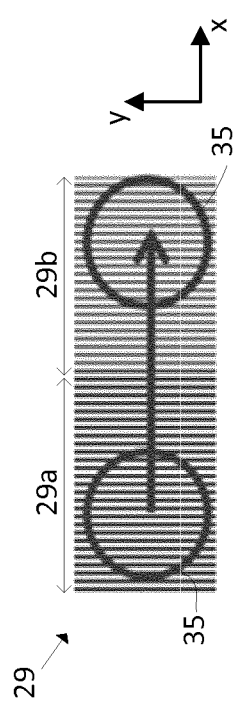

FIG. 2c schematically depicts a radiation beam profile 35 travelling across an alignment mark 29 comprising first and second segments 29a, 29b along with corresponding graphs G, D. The first and second segments 29a, 29b correspond with the first and second alignment marks 28a, 28b respectively. That is, the total size of the alignment marks 28a, 28b depicted in FIG. 2b has been reduced to that of the alignment mark 29 depicted in FIG. 2c. The length of a segment may depend upon a diameter of a radiation beam profile that is used to measure the segment. The segments 29a, 29b may have lengths of 40 micrometers or more each. The segments 29a, 29b may have lengths of 200 micrometers or less each. The segments 29a, 29b may, for example, have lengths of between approximately 40-80 micrometers each. The segments 29a, 29b may, for example, have lengths of 60 micrometers each, giving a total alignment mark length of 120 micrometers. The graphs G, D indicate the area of the radiation beam profile 35 that is within the first and second segments 29a, 29b respectively whilst the radiation beam profile 35 scans across the segments 29a, 29b.

An apparent spatial separation exists between the segments 29a, 29b when their positions are measured using the alignment system AS due to the differences in their known components of positional offsets F1, F2. In the example of FIG. 2c, the segments 29a, 29b have been printed on the substrate with the intention of having the segments 29a, 29b close together whilst maintaining a continuous pitch structure of the alignment mark 29. That is, if the first segment 29a ended with a space region then the second segment 29b would begin with a material region such that the pitch structure of the alignment mark 29 is continuous from one segment to the other. However, an unknown, real spatial separation between the segments 29a, 29b exists. The unknown separation is due to differences between the formations of each segment 29a, 28b. For example, when the segments 29a, 29b are formed on the substrate W1 the radiation that is used to form them may have passed through different patterned regions of a reticle and different parts of a projection system of a lithographic apparatus. As a result, the radiation experienced different effects which may contribute to the formation of the unknown separation. As another example, one segment 29a may have been formed during an exposure of a first target portion C of the substrate W1 and the other segment 29b may have been formed during an exposure of a second target portion C of the substrate that is adjacent the first target portion C. Slight differences between the exposure of the first target portion C of the substrate W1 and the exposure of the second target portion C of the substrate W1 may contribute to the unknown separation. The unknown separation between the segments 29a, 29b may be smaller than a pitch of the segments 29a, 29b. For example, the pitch of the segments 29a, 29b may be of the micrometer scale whereas the unknown separation may be of the nanometer scale (e.g. less than 100 nm).

When the radiation beam profile 35 begins travelling across the alignment mark 29, its entire area is within the first segment 29a, and as can be seen from the graphs G, D the entire alignment signal is received during illumination of the first segment 29a only. A component of the alignment signal that is received during illumination of the first segment 29a only may be referred to as a first component G of the alignment signal.

When the radiation beam profile 35 travels further across the alignment mark 29 it no longer illuminates the first segment 29a and its entire area is within the second segment 29b. As shown by the graphs G, D the entire alignment signal is received during illumination of the second segment 29b only. A component of the alignment signal that is received during illumination of the second segment 29b only may be referred to as a second component D of the alignment signal.

When the radiation beam profile 35 travels from the first segment 29a to the second segment 29b the alignment signal comprises a convolved component V of alignment signal components G, D that originates from both the first segment 29a and the second segment 29b. As shown by the graphs G, D, when the radiation beam profile 35 travels out of the first segment 29a and into the second segment 29b the contribution G of the first segment 29a to the alignment signal decreases and the contribution D of the second segment 29b to the alignment signal increases. The convolved component V is received during simultaneous illumination of both the first segment 29a and the second segment 29b. The convolved component V may be referred to as a third component V of the alignment signal.

In known alignment methods, the third component V of the alignment signal may be detected but is then discarded in subsequent alignment signal analysis and alignment mark position determination. In embodiments of the invention a relationship between the third component V and the relative positions of the two segments 29a, 29b may be determined and subsequently exploited to determine the positions of the segments 29a, 29b. The determined positions of the segments 29a, 29b may be averaged to determine an average position of the alignment mark 29. The relationship between the third component V and the positions of the two segments 29a, 29b may be determined by performing a calibration measurement with a calibration mark.

The calibration mark comprises two calibration segments. The calibration segments each comprise a periodic grating having the same periodicity in each calibration segment e.g. the calibration segments are of the form of the segments depicted in FIG. 2c or FIG. 2d. Characteristics of the calibration segments (e.g. relative positions, segment lengths, grating orientations and periodicities, etc.) are known. FIG. 3 is a flowchart of a method of performing a calibration measurement and using the results of the calibration measurement to determine the positions of two alignment mark segments using the third component of the alignment signal. In step S1 the calibration mark is illuminated with a radiation beam profile to produce a calibration alignment signal comprising a calibration component CV that is received during simultaneous illumination of both of the calibration segments. In step S2 the calibration alignment signal is analyzed and a relationship between the calibration alignment signal and the positions of the calibration segments is determined. The calibration measurement may be repeated with different calibration marks having different characteristics (e.g. different separations between calibration segments) to gain multiple different calibration alignment signals. The calibration alignment signals may be stored in a machine-readable medium for future use.

In step S3 the calibration alignment signal is fitted to the alignment signal resulting from the measurement of two segments 29a, 29b having unknown positions. In step S4 the results of the fit (e.g. fitting coefficients) are used to determine the positions of the two segments 29a, 29b.

The accuracy of the determination of the positions of the segments 29a, 29b via a calibration measurement depends upon how similar the calibration mark is to the alignment mark 29 that it is being used to analyses. For example, the greater the difference between the periodicity of the calibration segments and the periodicity of the alignment mark segments 29a, 29b then the less accurate the determination of the positions of the segments 29a, 29b may be. There is a relationship between the positions of the calibration segments and the calibration alignment signal. Similarly, there is a relationship between the positions of the segments 29a, 29b and the alignment signal. In general, the less similar the calibration mark and the alignment mark 29 are, the less similar those relationships will be and the less accurate the determination of the positions of the segments 29a, 29b will be.

The total size of the two alignment marks 28a, 28b shown in FIG. 2b may be reduced further than that shown in FIG. 2c without having an unacceptably large impact on the reproducibility and/or the accuracy of measurements made using the alignment system AS. This may be achieved by locating the alignment marks 28a, 28b adjacent each other such that they may be treated as two segments of a single alignment mark and reducing their lengths to distances at which the first, second and third components of the alignment signal may be generated by the alignment system AS and determining the positions of the two segments using the first, second and third components of the alignment signal. The lengths of the alignment marks 28a, 28b at which the first, second and third components of the alignment signal may be generated depends upon characteristics of the alignment system AS, e.g. the size and shape of the radiation beam profile 35.

Figure 2D:
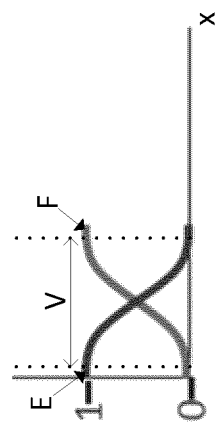
Figure 2D:
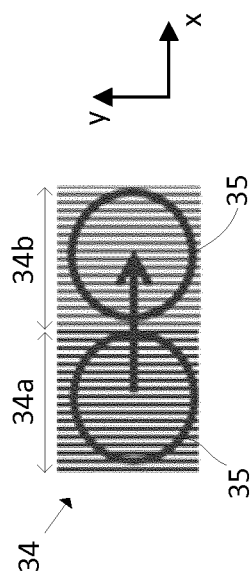
Figure 3:
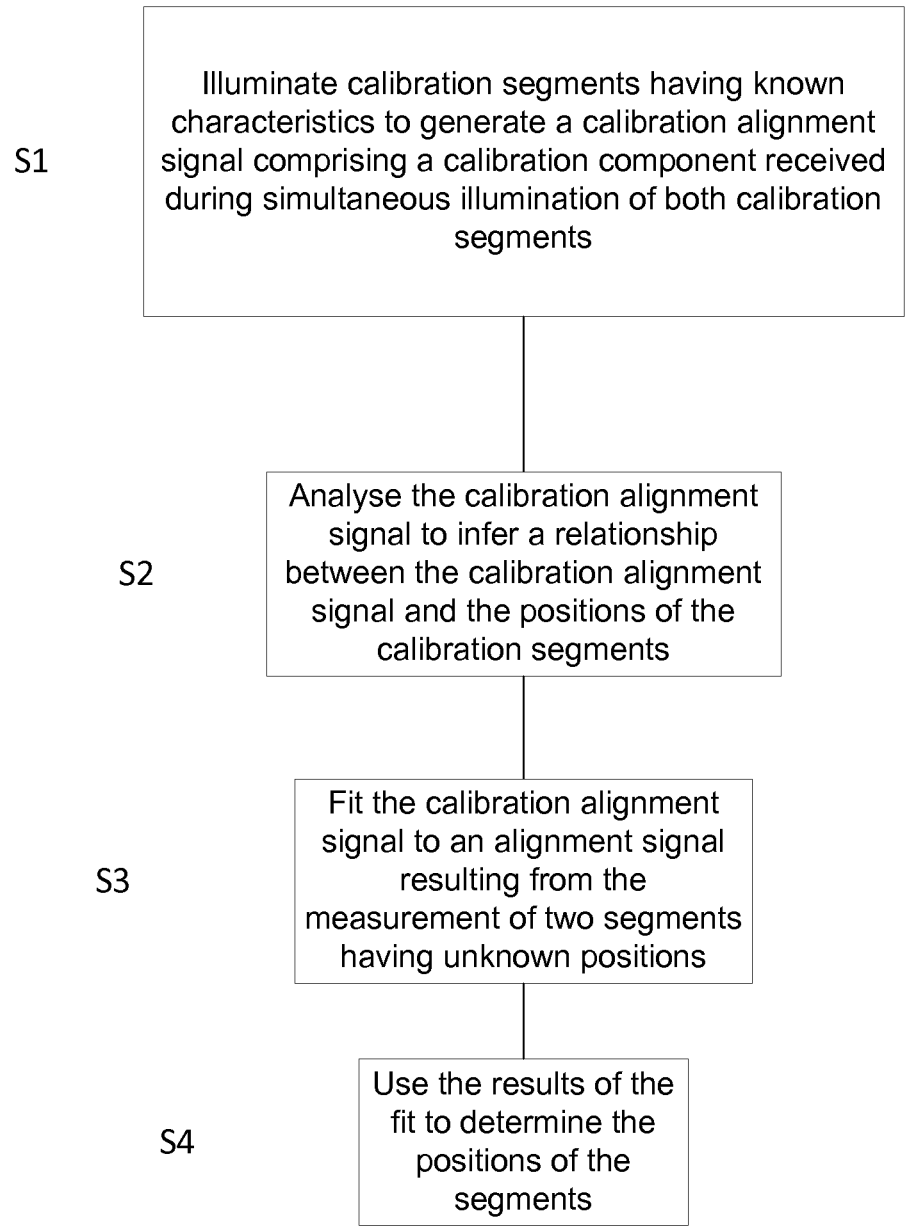
FIG. 3 is a flowchart of a method of determining the positions of alignment mark segments according to an embodiment of the invention.

FIG. 2d schematically depicts a radiation beam profile 35 travelling across an alignment mark 34 comprising a first segment 34a and a second segment 34b, along with corresponding graphs E, F. The length of a segment may depend upon a diameter of a radiation beam profile that is used to measure the segment. The segments 29a, 29b may have lengths of 40 micrometers or more each. The segments 29a, 29b may have lengths of 200 micrometers or less each. The first segment 34a and the second segment 34b may, for example, have lengths of approximately 40 micrometers each, giving a total alignment mark length of approximately 80 micrometers. The graphs E, F indicate the area of the radiation beam profile 35 that is within the first and second segments 34a, 34b respectively as the radiation beam profile 35 scans across the segments 34a, 34b.

When the radiation beam profile 35 begins travelling across the alignment mark 34, its entire area is within the first segment 34a, and as can be seen from the graphs E, F the entire alignment signal is received during illumination of the first segment 34a only.

When the radiation beam profile 35 travels further across the alignment mark 34 it no longer illuminates the first segment 34a and its entire area is within the second segment 34b, and as shown by the graphs E, F, the entire alignment signal is received during illumination of the second segment 34b only.

When the radiation beam profile 35 travels from the first segment 34a to the second segment 34b the alignment signal comprises a third component V of alignment signal components E, F that originates from both the first segment 34a and the second segment 34b. The third component V is received during simultaneous illumination of both the first segment 34a and the second segment 34b. The third component V may be referred to as a convolved component V. In the example of FIG. 2d the radiation beam profile 35 is circular and the length of each segment 34a, 34b is similar to a circumference of the radiation beam profile 35. The size and shape of the radiation beam profile 35 is such that it simultaneously illuminates both segments 34a, 34b for the majority of the resulting alignment signal and the majority of the alignment signal is formed by the third component V. However, as can be seen from the graphs E, F there is a first component of the alignment signal that is received during illumination of the first segment 34a only and there is a second component of the alignment signal that is received during illumination of the second segment 34b only. The graphs E, F show that, in the example of FIG. 2d, the majority of the alignment signal consists of the third component V. When the radiation beam profile 35 travels out of the first segment 34a and into the second segment 34b the contribution E of the first segment 34a to the alignment signal decreases and the contribution F of the second segment 34b to the alignment signal increases. As discussed above in relation to FIG. 2c, the relationship between the alignment signal and the positions of the two segments 34a, 34b may be determined by performing a calibration measurement with a calibration mark and analyzing the resulting calibration alignment signal. The calibration alignment signal may be fitted to the alignment signal resulting from the measurement of the two segments 34a, 34b. Results of the fit may be used to determine the positions of the two segments 34a, 34b. The determined positions of the two segments 34a, 34b may be averaged to determine a position of the alignment mark 34.

Another method of using the third component V in determining the positions of the segments includes deconvolving the third component V. Deconvolving the convolved component V and using the results of the deconvolution in subsequent alignment signal analysis provides alignment information that may be used to determine the positions of the segments 34a, 34b. In general, using the third component V in the determination of the positions of the segments 34a, 34b enables more efficient use of the alignment marks 28a, 28b and therefore also enables a reduction in size of the alignment marks 28a, 28b without resulting in the loss of accuracy and/or reproducibility of measurements made using the alignment marks 28a, 28b. The reproducibility of a measurement may be defined as the ability of the measurement to be replicated at different times, locations and/or by different people. If a measurement has a high degree of reproducibility, it may be described as having a high precision.

Figure 4:
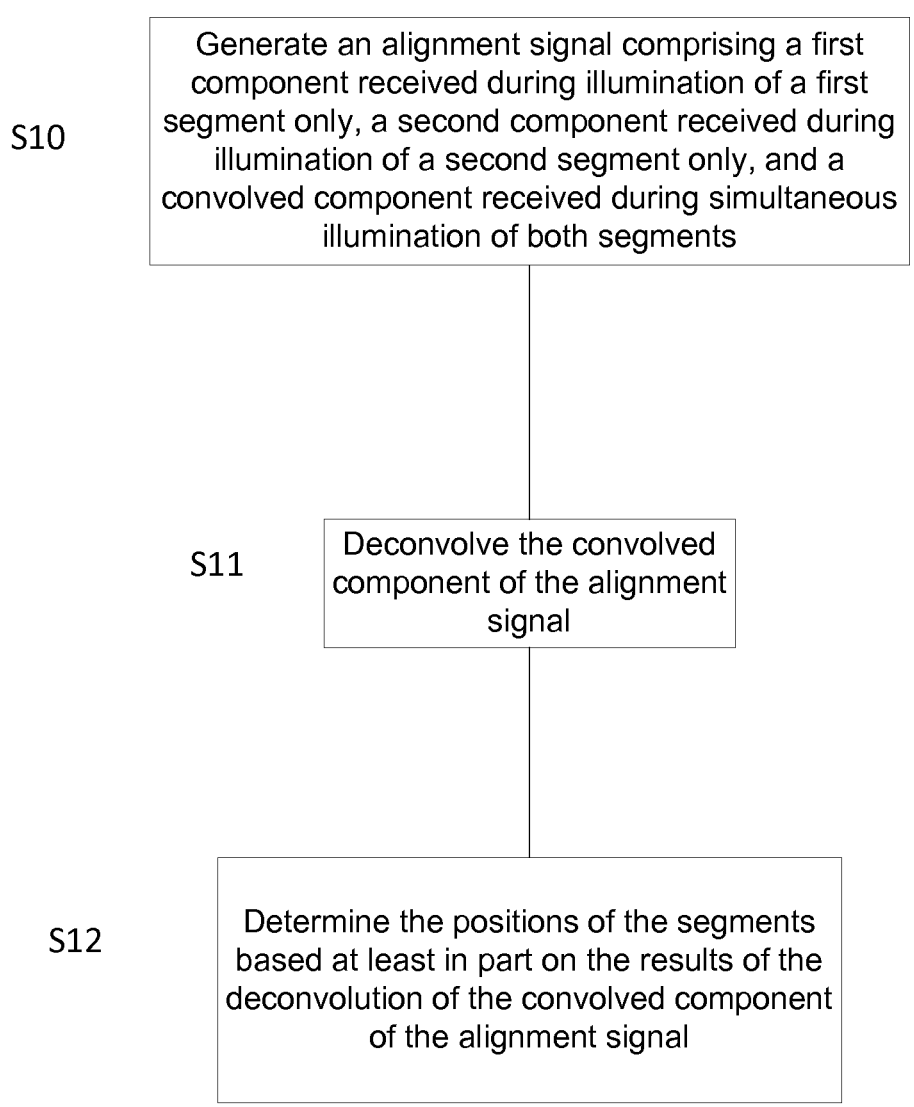
FIG. 4 is a flowchart of a method of determining the positions of alignment mark segments according to an embodiment of the invention.

FIG. 4 is a flowchart of a method of determining the positions of alignment mark segments 34a, 34b that involves deconvolving a third component V of an alignment signal. In step S10, an alignment signal is generated, e.g. by an alignment system AS such as that depicted in FIG. 1. The alignment signal comprises a first component received during illumination of a first segment 34a of an alignment mark 34 only, a second component received during illumination of a second segment 34b of the alignment mark 34 only, and a convolved component V received during simultaneous illumination of both segments 34a, 34b. In step S11 the convolved component V is deconvolved. Multiple deconvolution techniques are described below. In step S12 the positions of the alignment mark segments 34a, 34b are determined based at least in part on the results of the deconvolution.

Figure 5A:
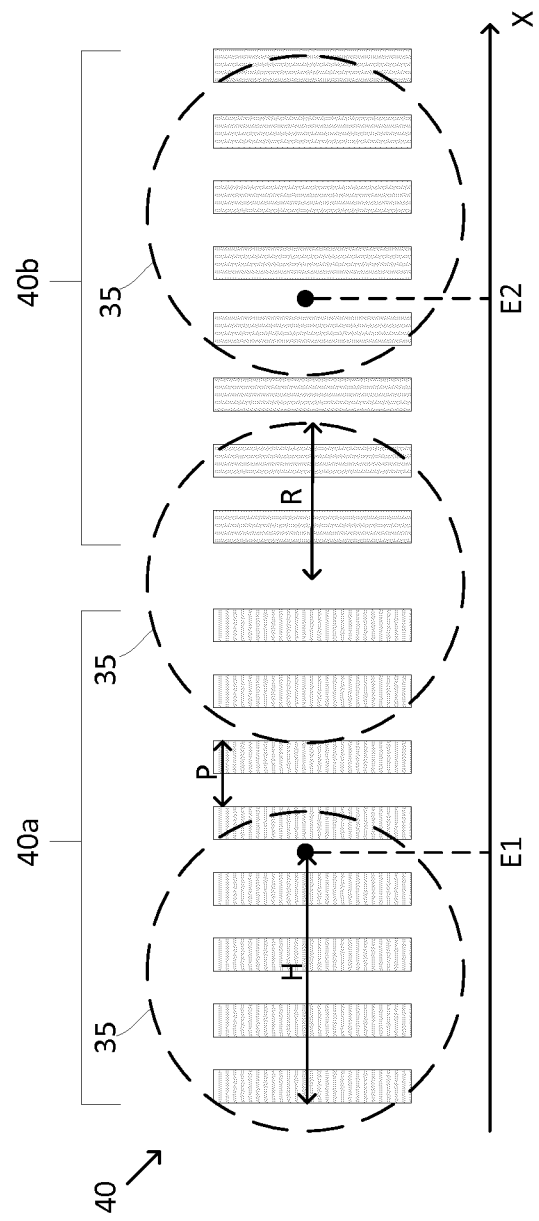

One method of deconvolving the convolved component V of the alignment signal includes fitting a sine function and/or a cosine function to the convolved component V of the alignment signal. FIG. 5a schematically depicts a radiation beam profile 35 scanning across an alignment mark 40 comprising a first segment 40a and a second segment 40b. In the example of FIG. 5a, the radiation beam profile 35 is moving in the positive x direction across the alignment mark 40. In the example of FIG. 5a, the first segment 40a and the second segment 40b have the same length in the x direction. The first segment 40a comprises a grating having a first pitch P. The second segment 40b comprises a grating having the same pitch P. The segments 40a, 40b are sub-segmented having different known components of positional offsets F1, F2 between a center of their at-resolution features and a center of their space regions. Sub-segmentation of the alignment mark 40 has been omitted from FIG. 5a for clarity. Half of the length of each segment 40a, 40b is represented by the label H. The radius of the radiation beam profile 35 is represented by the label R. An expected position of the first segment 40a is represented by label E1. An expected position of the second segment 40b is represented by label E2.

Figure 5B:
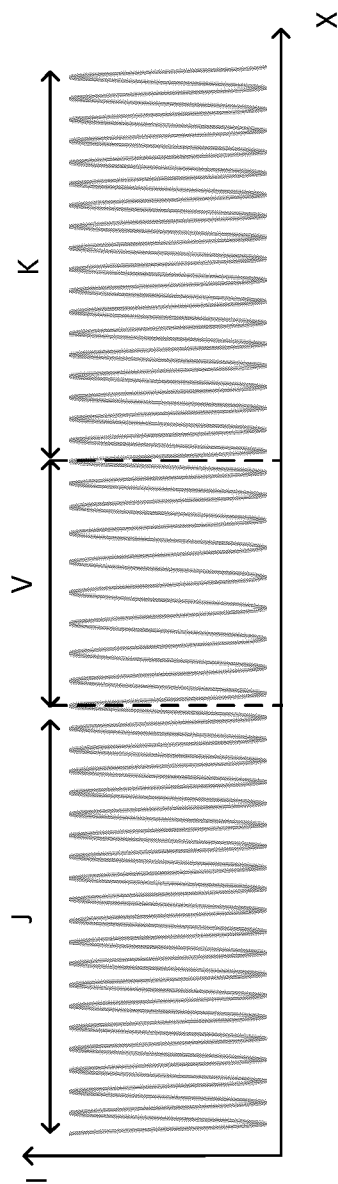

FIG. 5b shows an alignment signal resulting from the radiation beam profile 35 travelling across the alignment mark 40. The alignment signal is plotted as an intensity of radiation I detected by the alignment system AS versus the position of the radiation beam profile 35 in the x direction. The alignment signal comprises a first component J received during illumination of the first segment 40a only, a second component K received during illumination of the second segment 40b only, and a convolved component V received during simultaneous illumination of both segments 40a, 40b.

FIG. 5c shows a graph of alignment position deviation (APD) as a function of the position of the radiation beam profile 35 as it travels across the alignment mark 40. The alignment position deviation of a segment 40a, 40b is the difference between a measured position of the segment 40a, 40b and an expected position E1, E2 of the segment 40a, 40b. The expected positions E1, E2 of the segments 40a, 40b are known. The measured positions of the segments 40a, 40b are to be determined using the alignment system AS and an alignment method that involves using the third component V of the alignment signal.

The different known components of positional offsets F1, F2 between a center of their at-resolution features and a center of their space regions have introduced a difference in the alignment position deviation D1 of the first segment 40a and the alignment position deviation D2 of the second segment 40b. An unknown separation that is due to differences between the formations of each segment 40a, 40b may also contribute to the difference between the alignment position deviations of the first segment 40a and the second segment 40b. The separation between the first segment 40a and the second segment 40b has been exaggerated in FIG. 5a for clarity. As can be seen from FIG. 5c, the alignment position deviation of the alignment mark 40 is equal to the alignment position deviation D1 of the first segment 40a during illumination of the first segment 40a only. The alignment position deviation of the alignment mark 40 is equal to the alignment position deviation D2 of the second segment 40b during illumination of the second segment 40b only. The value of the alignment position deviation of the alignment mark 40 transitions from D1 to D2 during simultaneous illumination of both segments 40a, 40b (i.e. within the convolved component V).

One or more functions may be fitted to the alignment signal. In the case of a single periodic structure, such as, for example, segment 40a or, as another example, alignment mark 28a, being scanned by a radiation beam profile 35 the resulting alignment signal modulates. A sine function and/or a cosine function may be fitted to the modulating alignment signal. For example, the sine function may take the following form:

$$D\max * \sin\left[(Sp - D) * \frac{2\pi}{P}\right]$$

Where Dmax is the amplitude of the alignment signal; Sp is the position of the radiation beam profile 35 during the measurement scan; D is the alignment position deviation of the periodic structure; and P is a detected pitch of the alignment signal. Phase information may be extracted from the fitted sine function and/or a fitted cosine function to determine the position of the periodic structure.

In the case of two periodic structures, such as, for example, segments 40a, 40b of the alignment mark 40 being scanned by a radiation beam profile 35 the resulting alignment signal may indicate a gradual shift in the measured position of the alignment mark 40 when the radiation beam profile 35 is simultaneously illuminating both segments 40a, 40b of the alignment mark 40. The gradual shift in the measured position of the alignment mark 40 is due to the radiation beam profile 35 integrating the positions of the periodic structures that form the segments 40a, 40b whilst the radiation beam profile 35 travels from the first segment 40a to the second segment 40b. The gradual shift in the measured position of the alignment mark 40 is a function of the position of the radiation beam profile 35 relative to the positions of the segments 40a, 40b.

The following function (the "sine fit function") is an example of the form of a sine function that may be fitted to the alignment signal resulting from two segments 40a, 40b having the same grating pitch P:

$$D\mathrm{max} * \sin\left[(Sp - f\{Sp, D1, D2\}) * \frac{2*\pi}{P}\right]$$

Where $f$ is an alignment position deviation function whose output is the alignment position deviation; D1 is the alignment position deviation of the first segment 40a; and D2 is the alignment position deviation of the second segment 40b. Phase information may be extracted from the sine fit function once it has been fitted to an alignment signal. The extracted phase information may be used to determine the positions of the segments 40a, 40b. The sine fit function may take other forms for different combinations of radiation beam profile 35 and segments 40a, 40b. The form of the sine fit function for a given combination of radiation beam profile 35 and segments 40a, 40b may be determined by performing a calibration measurement as discussed above.

The alignment position deviation function $f$ is formulated based upon knowledge of the size and shape of the radiation beam profile 35 and knowledge of the first and second components of the alignment signal. This knowledge may be acquired by performing a calibration measurement as discussed above.

The alignment signal may be separated into different sections to better understand the application of the sine fit function. For example, a first section of the alignment signal may be defined as the alignment signal produced during illumination of the first segment 40a only. When the following condition is satisfied:

$Sp < E1 + H - R$

Then the alignment position deviation function takes the following form:

$f\{Sp, D1, D2\} = D1$.

That is, during illumination of the first segment 40a only, the alignment position deviation is equal to the alignment position deviation of the first segment D1.

A second section of the alignment signal may be defined as the alignment signal produced during simultaneous illumination of both segments 40a, 40b. When the following condition is satisfied:

$E1 + H - R < Sp < E2 - H + R$

Then, as an example, in the case that a sine function is fitted to the convolved component V, the alignment position deviation function may be approximated using the following equation:

$$f\{Sp, D1, D2\} = (D2 - D1)/2 * \sin\left\{\frac{\left\{Sp - \frac{E1 + E2}{2}\right\} * 2 * \pi}{4 * R}\right\} + \frac{(D1 + D2)}{2}$$

That is, during simultaneous illumination of both segments 40a, 40b, the alignment position deviation is equal to a convolved alignment position deviation comprising the alignment position deviations D1, D2 of both segments 40a, 40b. Other functions such as, for example, a cosine function may be fitted to the convolved component V. The alignment position deviation function may take other forms.

A third section of the alignment signal may be defined as the alignment signal produced during illumination of the second segment 40b only. When the following condition is satisfied:

$Sp > E2 - H + R$

Then the alignment position deviation function takes the following form:

$f\{Sp, D1, D2\} = D2$

That is, during illumination of the second segment 40b only, the alignment position deviation is equal to the alignment position deviation of the second segment D2.

The term $f\{Sp, D1, D2\}$ has two unknowns, namely D1 and D2. By substituting the different forms of $f\{Sp, D1, D2\}$ into the sine fit function for corresponding sections of the alignment signal, the values of D1 and D2 may be determined. The measured positions of the segments 40a, 40b may be determined by adding the expected positions E1 and E2 to the values of D1 and D2 respectively. The above is a specific example of the sine fit function which results in two alignment positions of the segments 40a, 40b from determined values of D1 and D2. The alignment signal may be separated in different ways and the function that is fitted to the alignment signal and the alignment position deviation function may take other forms. The determined positions of the segments 40a, 40b may be averaged to determine the position of the alignment mark 40.

The alignment position deviation function $f$ may be expressed as a convolution of a function that represents the radiation beam profile 35, a function that represents a conversion performed by the alignment system AS that converts the detected radiation into an alignment signal (the "sensor transfer function") and a function that represents the positions of the two segments 40a, 40b. The concept of a convolved component V is now discussed. In general terms, a convolution may be described as a mathematical operation that acts on a first function X and a second function Y to produce a third function Z that may be considered to be a modified version of the first function X and the second function Y. In the examples of FIG. 5a to FIG. 5c the first function X may represent the radiation beam profile 35. The second function Y may represent the first segment 40a and the second segment 40b. The third function Z may arise when the first function X is convolved with the second function Y by scanning the radiation beam profile 35 across the alignment mark 40 in an alignment system AS to produce an alignment signal. The third function Z may represent the convolved component V of the alignment signal that is received during simultaneous illumination of both segments 40a, 40b (i.e. after the sensor transfer function has converted the detected radiation into an alignment signal). By determining the first function X and measuring the third function Z, the third function Z may be deconvolved to determine the second function Y. That is, the convolved component V of the alignment signal (i.e. the component of the alignment signal that is discarded in known alignment methods) may be deconvolved, using knowledge of the radiation beam profile 35 and the sensor transfer function, to determine positional information about the first and second segments 40a, 40b.

A calibration measurement may be performed to determine the form of the third function Z for a convolution between a known first function X (a radiation beam profile 35), a known second function Y (a calibration mark having known characteristics) and the sensor transfer function. The calibration mark comprises two segments having the same pitch P amongst other known characteristics (e.g. relative positions, segment lengths and orientations). The calibration measurement involves illuminating the calibration mark (the second function Y) with the radiation beam profile 35 (the first function X) and applying the sensor transfer function to produce an alignment signal comprising a convolved component V (the third function Z). The resulting calibration alignment signal is indicative of the alignment position deviation function $f$. When a measurement is performed with the alignment system AS on an alignment mark 40 comprising segments 40a, 40b having unknown positions the information obtained from the calibration alignment signal may contribute to the fitting of one or more functions to the alignment signal resulting from the alignment mark 40.

Multiple calibrations may be performed using different calibration marks having different known characteristics. Performing multiple calibrations using different calibration marks provides information about the third function Z for different alignment mark characteristics that may contribute to the deconvolution of the convolved component V of an alignment signal. For example, two calibrations may be performed on two calibration marks, the first calibration mark having a spatial separation between segments of 100 nm and the second calibration mark having a spatial separation between segments of 10 nm. The information gained form the calibration alignment signal about the third function Z for the spatial separation of 100 nm may contribute to the deconvolution of a convolved component V of an alignment signal produced by the alignment system AS. If the results of the deconvolution indicate that the spatial separation between the two segments 40a, 40b is closer to 10 nm than 100 nm then the deconvolution may be performed again using information gained from the calibration alignment signal about the third function Z for the spatial separation of 10 nm. It should be noted that for spatial separations that are much smaller than the pitch P of the segments 40a, 40b then the convolved component V of an alignment signal is not expected to vary much as a function of the spatial separation. Hence only one calibration measurement with a single calibration mark may be performed to determine information about the third function Z.

For example, as mentioned earlier, the alignment position deviation function $f\{Sp, D1, D2\}$ is formulated based upon knowledge of the size and shape of the radiation beam profile 35, knowledge of the sensor transfer function and knowledge of the first and second components of the alignment signal. A calibration measurement may be performed in order to obtain this knowledge. The calibration alignment signal resulting from the calibration measurement may be analyzed to determine a form of the convolved component V. In the above example a sine function was fitted to the alignment signal to deconvolve the convolved component V. Different functions such as, for example, a cosine function may be fitted to the alignment signal.

Figure 6:
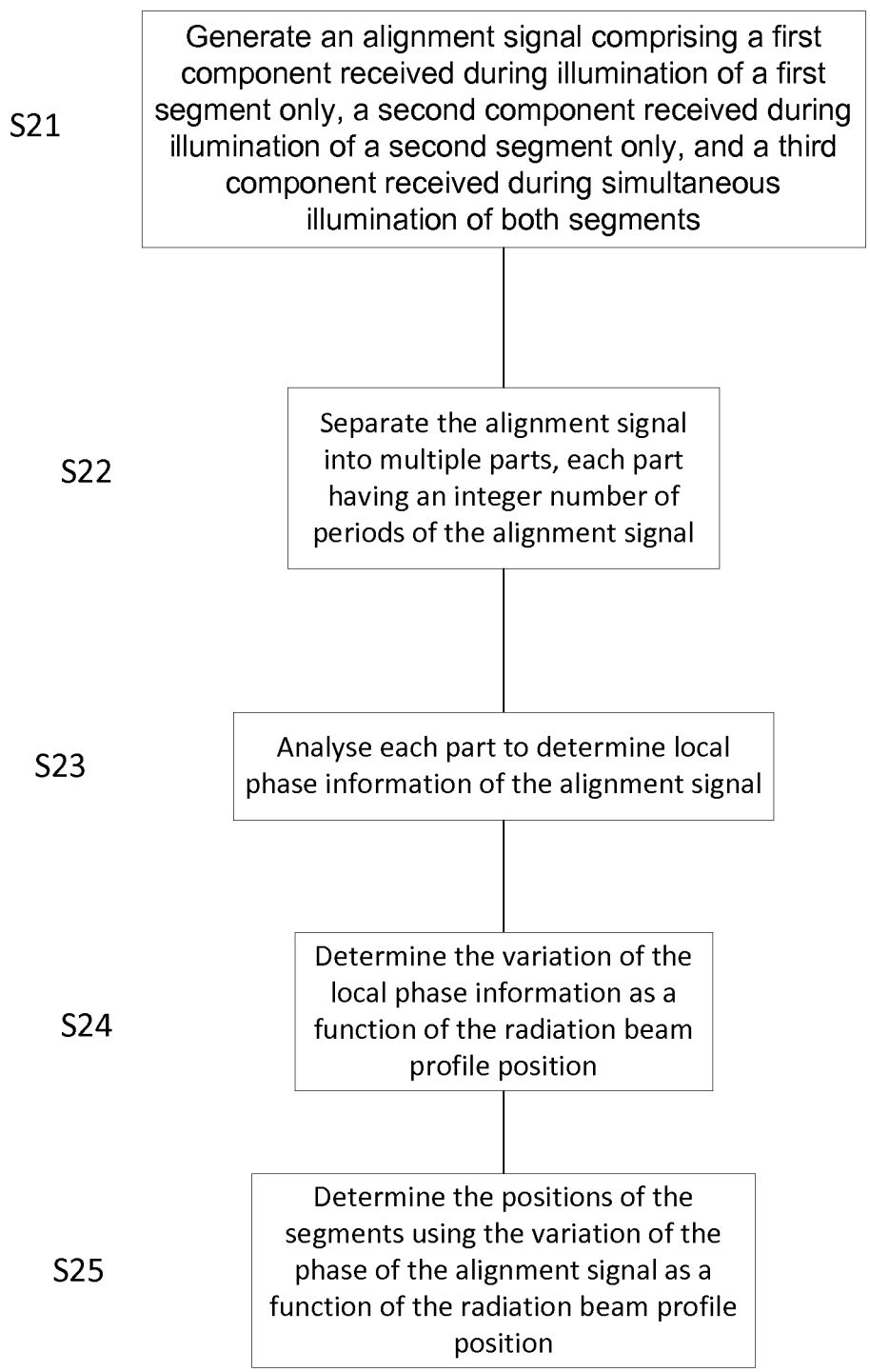
FIG. 6 is a flowchart of a method of determining the positions of alignment mark segments according to an embodiment of the invention.

Other methods that use the third component of the alignment signal to determine the positions of the segments 40a, 40b are now discussed. FIG. 6 is a flowchart of a method of determining the positions of alignment mark segments 40a, 40b that involves separating the alignment signal into multiple parts and analyzing each part separately. In step S21 an alignment signal is generated, the alignment signal comprising a first component received during illumination of a first segment only, a second component received during illumination of a second segment only, and a third component received during simultaneous illumination of both segments. In step S22 the alignment signal is separated into multiple distinct parts, each part consisting of an integer number of periods of the periodic alignment signal. In step S23 each part of the alignment signal is analyzed independently to extract local phase information from the alignment signal. In step S24 the results of the analysis of each part of the alignment signal are combined and a variation of the phase of the alignment signal as a function of the position of the radiation beam profile 35 is determined. In step S25 the variation of the phase of the alignment signal as a function of the position of the radiation beam profile 35 is used to determine the positions of the segments 40a, 40b.

Figure 7A:
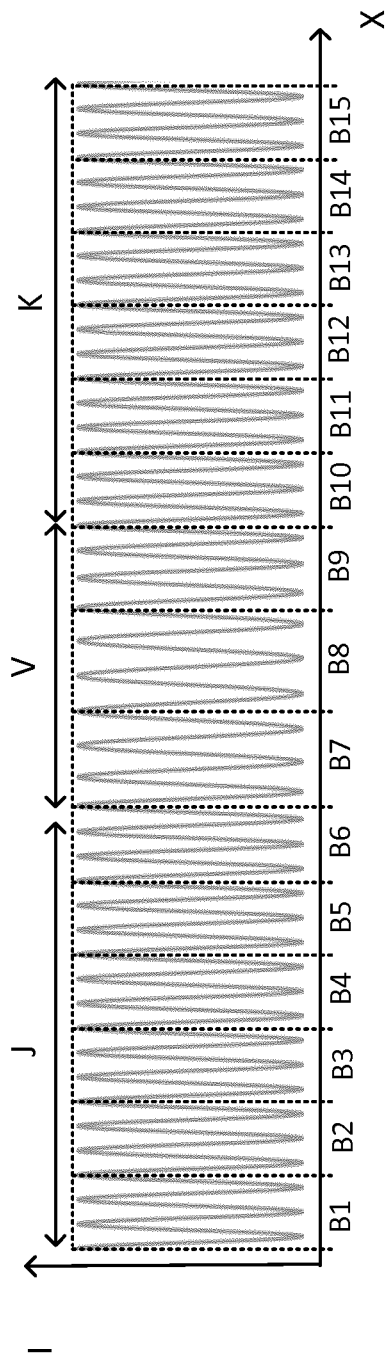
FIGS. 7a-7b, consist of FIG. 7a and FIG. 7b, shows an alignment signal and an associated graph of alignment position deviation according to an embodiment of the invention.
Figure 7B:
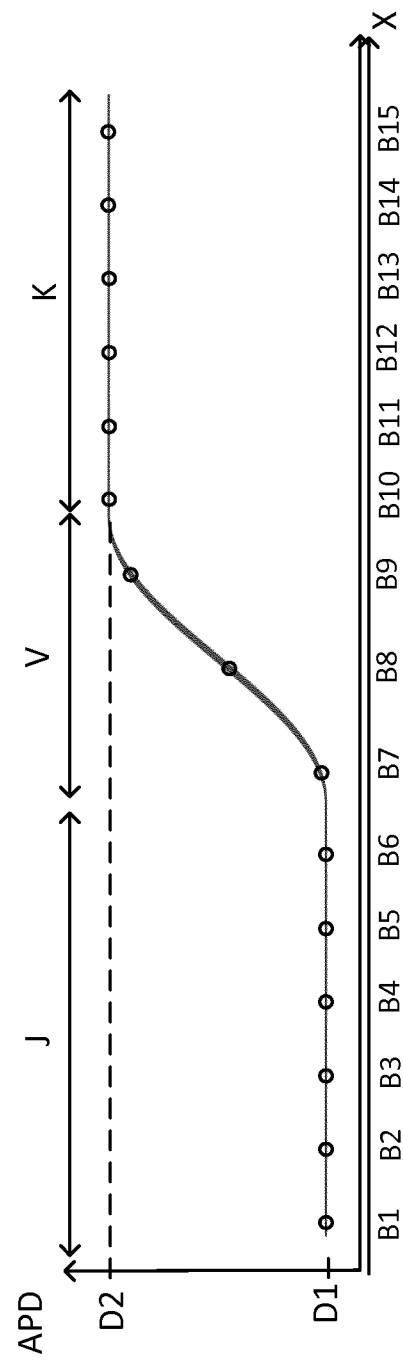

FIG. 7a shows an alignment signal comprising a first component J received during illumination of a first segment only, a second component K received during illumination of a second segment only, and a third component V received during simultaneous illumination of both segments. The alignment signal has been separated into distinct parts B1-B15. In the example of FIG. 7a each part B1-B15 contains three periods of the alignment signal. The parts B1-B15 may contain a larger or smaller number of periods of the alignment signal. The alignment signal may be separated into a different number of parts B1-B15. FIG. 7b shows a graph of the alignment position deviation (APD) as a function of the position of the radiation beam profile 35 as it travels across the segments 40a, 40b. The alignment position deviation of the alignment mark 40 is equal to the alignment position deviation D1 of the first segment 40a during illumination of the first segment 40a only. The alignment position deviation of the alignment mark 40 is equal to the alignment position deviation D2 of the second segment 40b during illumination of the second segment 40b only. The value of the alignment position deviation of the alignment mark 40 transitions from D1 to D2 during simultaneous illumination of both segments 40a, 40b (i.e. within the convolved component V).

Each part B1-B15 of the alignment signal has been analyzed to determine associated local phase information. Local alignment mark 40 position information associated with the local phase information extracted from each part B1-B15 is represented by circles on the graph of FIG. 7b. Analyzing each part of the alignment signal may include performing a fast Fourier transform on each part of the alignment signal. A fast Fourier transform may only provide useful alignment signal phase information if the alignment signal part it is performed on comprises a single frequency component. Analyzing each part of the alignment signal may include fitting a sine function and/or a cosine function to each part of the alignment signal. It will be appreciated that other functions may be fitted to the different parts of the alignment signal. The form of the functions that may be fitted to the parts of the alignment signal may be determined by performing a calibration measurement as discussed above. Combining the local phase information determined using each part B1-B15 allows a variation of the phase of the alignment signal to be determined as a function of position of the radiation beam profile 35. The positions of the segments 40a, 40b may be determined using the variation of the phase of the alignment signal as a function of the position of the radiation beam profile 35.

The method of separating the alignment signal into distinct parts B1-B15 and analyzing each part separately may be considered as being similar to performing rectangular windowing analysis of the alignment signal. Another method of using the third component V in determining the positions of the segments 40a, 40b includes separating the alignment signal into multiple indistinct (i.e. overlapping) parts. The overlapping parts of the alignment signal may be analyzed using non-rectangular windowing analysis to extract local phase information from the alignment signal. The local phase information determined from each overlapping part may be combined to determine the variation of the phase of the alignment signal as a function of the position of the radiation beam profile 35. The positions of the segments 40a, 40b may be determined using the variation of the phase of the alignment signal as a function of the position of the radiation beam profile 35.

Another method of using the third component V in determining the positions of the segments 40a, 40b includes fitting one or more functions, e.g. a sine function and/or cosine function, to the alignment signal, separating the one or more fitted functions into multiple parts and applying windowing analysis to the parts to extract local phase information from the alignment signal. The windows used may be rectangular if the parts are distinct or non-rectangular if the parts are overlapping. The local phase information from each window may be combined to determine the variation of the phase of the alignment signal as a function of radiation beam profile 35. The positions of the segments 40a, 40b may be determined using the variation of the phase of the alignment signal as a function of the position of the radiation beam profile 35.

Figure 8:
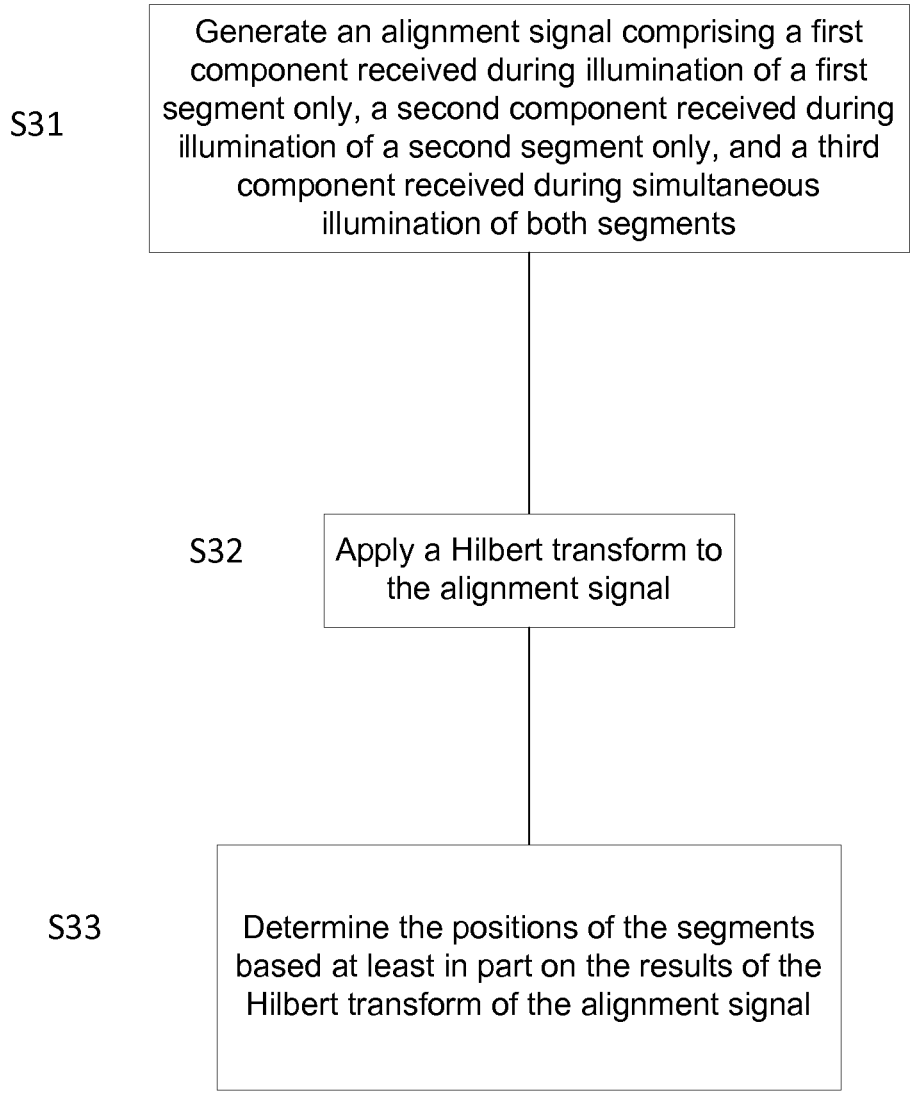
FIG. 8 is a flowchart of a method of determining the positions of alignment mark segments according to an embodiment of the invention.

Another method of using the third component V in determining the positions of the segments 40a, 40b includes performing a Hilbert transform on the alignment signal. FIG. 8 is a flowchart of a method of determining the positions of alignment mark segments 40a, 40b that involves performing a Hilbert transform on the alignment signal. In step S31 an alignment signal is generated, the alignment signal comprising a first component received during illumination of a first segment only, a second component received during illumination of a second segment only, and a third component received during simultaneous illumination of both segments. In step S32 a Hilbert transform is performed on the alignment signal. In step S33 the positions of the segments 40a, 40b are determined based at least in part on the results of the Hilbert transform of the alignment signal.

The Hilbert transform is a known tool in signal analysis that represents a narrow-band signal in terms of its amplitude modulation and its frequency (i.e. phase) modulation. Performing a Hilbert transform on the alignment signal produces a phase response of the alignment signal as a function of the position of the radiation beam profile 35. A set of location dependent alignment signal phases may be obtained by performing a Hilbert transform on the alignment signal. The Hilbert transform includes adding an imaginary signal that has been rotated by 90 degrees to the measured alignment signal for each frequency component in the alignment signal, thus making the alignment signal complex. Complex numbers are commonly used in signal analysis because they provide a convenient representation of periodically varying signals such as the alignment signal. The absolute value of a complex number that represents a periodically varying signal may correspond with the amplitude of the periodically varying signal. A complex number may be represented in the complex plane. The argument of a complex number provides the angle between the line joining the point of the complex number in the complex plane to the origin of the complex plane and the positive real axis of the complex plane. The argument of a complex number that represents a periodically varying signal may correspond with the phase of the periodically varying signal. Local alignment signal amplitude may be extracted from the complex alignment signal by determining an amplitude of each complex alignment signal component. Local alignment signal phase information may be extracted from the complex alignment signal by determining the argument of each complex alignment signal component. It will be appreciated that the Hilbert transform method of using the third component V in determining the positions of the segments may only be used for narrow-band alignment signals. If the alignment signal comprises a mixture of multiple narrow-band alignment signal contributions then the multiple narrow-band alignment signal contributions may be separated using, for example, band pass filters before the Hilbert transform is performed on the alignment signal contributions.

The Hilbert transform embodiment is particularly robust in response to disturbances in processing and low alignment signal strength conditions. For example, this embodiment has shown robustness improvements when analyzing an alignment signal produced from alignment marks comprising fine features, e.g. alignment marks used in fine positioning with a short-stroke module. In addition, the Hilbert transform embodiment may be more robust than more traditional fits used for alignment signals, e.g. a sine function fit. Moreover, the calculation time of the Hilbert transform embodiment is reduced in comparison to a method based purely on fitting a sine function and/or a cosine function to the alignment signal.

Multiple methods of using the third component V of the alignment signal to determine the position of alignment mark segments and/or the position of the alignment mark have been described above. It will be appreciated by a person skilled in the art that other signal analysis techniques than those discussed herein may be utilized when using the third component V of an alignment signal to determine the positions of alignment mark segments and/or the position of the alignment mark.

Using the third component when determining the positions of the alignment marks 28a, 28b may enable the total size of the alignment marks to be reduced, i.e. the distance S between the alignment marks 28a, 28b may be reduced or removed and/or the length of the alignment marks 28a, 28b may be reduced without affecting the reproducibility and/or the accuracy of measurements made using the alignment system AS. One example of when a reduction in the size of alignment marks on the substrate (via the deconvolution method described above) may be particularly useful is when an intrafield alignment measurement is performed by the alignment system AS. Intrafield alignment involves measuring the position of intrafield alignment marks with the alignment system AS in order to determine distortion effects on positions of target portions C of the substrate W. The target portions C may distort due to, for example, heating of the substrate W and/or electrostatic clamping of the substrate W to a substrate table WT1, etc. Target portions C may be referred to more commonly as exposure areas or dies.

Figure 9B:
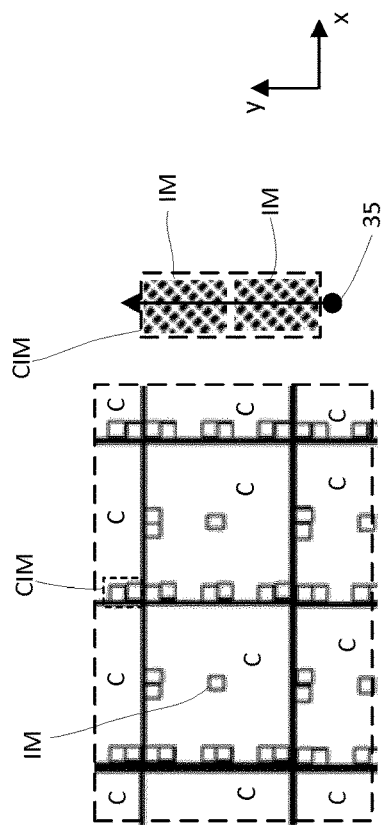
FIGS. 9a-9b consist of FIG. 9a and FIG. 9b, schematically depicts layouts of intrafield alignment marks according to an embodiment of the invention.
Figure 9A:
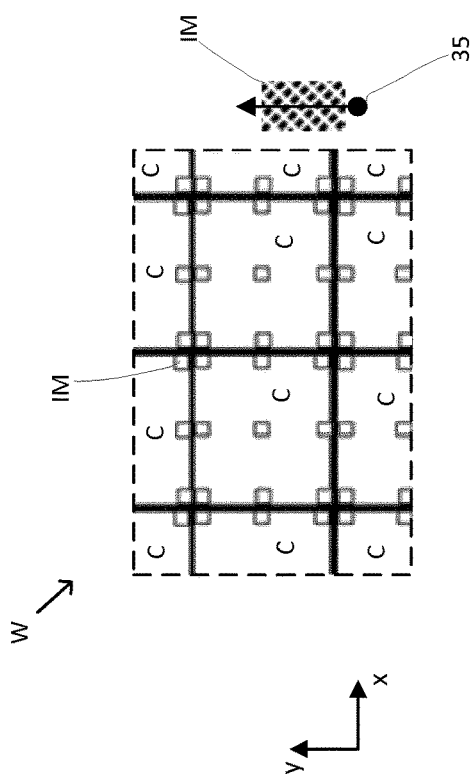

FIG. 9a is a schematic depiction of a typical layout of intrafield alignment marks IM on a substrate W. The intrafield alignment marks IM are located on the target portions C of the substrate W. Some intrafield alignment marks IM may be present in scribe lanes of the substrate W. In the example of FIG. 9a, the intrafield alignment marks IM are present at positions along a perimeter of the target portions C as well as in the center of the target portions C. The intrafield alignment marks IM may be located elsewhere on the target portions C. A radiation beam profile 35 is shown travelling across a magnified intrafield alignment mark IM to the right of FIG. 9a. In the example of FIG. 9a the intrafield alignment mark IM comprises periodic gratings that are arranged at a 45° angle to the direction of travel of the radiation beam profile 35 such that x position measurements and y position measurements may be performed simultaneously. Any embodiment of the invention applies to the 45° arrangement of periodic gratings and not just to gratings that are periodic in a single direction. The intrafield alignment mark IM may take other forms than that schematically depicted in FIG. 9a. One scan of the radiation beam profile 35 across the intrafield alignment mark IM results in one position measurement (x and y coordinates) of the one intrafield alignment mark IM.

FIG. 9b is a schematic depiction of a stitched layout of intrafield alignment marks IM according to an embodiment of the invention. The layout depicted in FIG. 9b is referred to as a stitched layout because some of the intrafield alignment marks IM of the target portions C are adjacent each other in the scanning direction of the radiation beam profile 35 (i.e. the intrafield alignment marks IM are "stitched" together). As can be seen on comparison between FIG. 9a and FIG. 9b, the number of intrafield alignment marks IM along the perimeters of the target portions C has doubled in the stitched layout of intrafield alignment marks IM. A radiation beam profile 35 is shown travelling across two magnified intrafield alignment marks IM to the right of FIG. 9b. The two intrafield alignment marks IM shown to the right of FIG. 9b are adjacent each other in the scanning direction of the radiation beam profile 35. The combination of multiple intrafield alignment marks that are adjacent each other in the scanning direction of the radiation beam profile 35 may be referred to as a concatenated intrafield alignment mark CIM. Any alignment mark that comprises two segments, e.g. the alignment marks shown in FIG. 2c, FIG. 2d and FIG. 5a, may be referred to as a concatenated alignment mark. Performing one scan of the radiation beam profile 35 across the concatenated intrafield alignment mark CIM results in an alignment signal comprising a third component V that is received during simultaneous illumination of the intrafield alignment marks IM. The resulting alignment signal may be used, in conjunction with the method of using the third component V described above, to determine two position measurements (x and y coordinates) of the two intrafield alignment marks IM.

A concatenated intrafield alignment mark may comprise two intrafield alignment marks IM from different target portions C of the substrate W. The two intrafield alignment marks IM that form the concatenated intrafield alignment mark CIM may be considered to be first and second segments of the concatenated intrafield alignment mark CIM. In general any two alignment marks and/or parts of alignment marks that are simultaneously illuminated by a radiation beam profile 35 to produce an alignment signal having a convolved component may be considered as being first and second segments of an alignment mark. Performing intrafield alignment with concatenated intrafield alignment marks CIM comprising intrafield alignment marks IM from neighboring target portions C and treating the resulting alignment signal with any of the methods described above that use the third component V of the alignment signal to determine the positions of the intrafield alignment marks may provide an increase in the accuracy and/or the reproducibility of measurements made during intrafield alignment. A stitched layout of intrafield alignment marks IM (such as the example depicted in FIG. 9b) enables a larger number of intrafield alignment marks to be measured per scan with the radiation beam profile 35 which, in turn, may reduce the amount of time required to perform intrafield alignment.

In this document, the term "alignment mark segment" may be interpreted as meaning a patterned area that may be used to determine a substrate position using an alignment system. First and second alignment mark segments may be simultaneously illuminated with radiation using an alignment system to produce an alignment signal comprising a convolved component.

In an embodiment, there is provided a method of determining the position of an alignment mark on a substrate, the alignment mark comprising a first segment and a second segment, the method comprising: illuminating the alignment mark with radiation, detecting radiation diffracted by the alignment mark and generating a resulting alignment signal, the alignment signal comprising a first component received during illumination of the first segment only, a second component received during illumination of the second segment only, and a third component received during simultaneous illumination of both segments; and determining the positions of the segments using the first component, the second component and the third component of the alignment signal. In an embodiment, the determining uses the results of a calibration measurement on a calibration mark having known characteristics to produce a calibration alignment signal from which a relationship between the alignment signal and the positions of the segments may be determined. In an embodiment, the determining includes fitting the calibration alignment signal to the alignment signal. In an embodiment, the determining includes deconvolving the third component of the alignment signal. In an embodiment, the deconvolution is based upon knowledge of a size and shape of a profile of the radiation and knowledge of the first and second components. In an embodiment, the calibration alignment signal is used to deconvolve the third component of the alignment signal. In an embodiment, the determining involves separating the alignment signal into multiple parts and analyzing each part to extract local phase information from the alignment signal. In an embodiment, analyzing each part of the alignment signal includes fitting one or more functions to each part of the alignment signal. In an embodiment, the determining includes performing a Hilbert transform on the alignment signal to produce a complex alignment signal. In an embodiment, the first segment comprises a sub-segmented grating having a first known component of positional offset between a center of its at-resolution features and a center of its space regions and the second segment comprises a sub-segmented grating having a second known component of positional offset between a center of its at-resolution features and a center of its space regions, the first known component of positional offset being different to the second known component of positional offset. In an embodiment, the substrate comprises first and second target portions, and wherein the first segment is located in the first target portion and the second segment is located in the second target portion such that the alignment mark is a concatenated intrafield alignment mark.

In an embodiment, there is provided a lithographic apparatus comprising a substrate table for holding a substrate; a projection system for projecting a patterned radiation beam onto a target portion of a substrate held by the substrate table; and an alignment system configured to perform a method as described herein.

In an embodiment, there is provided an alignment system comprising a radiation source, a detector and a processor, the processor being configured to: receive an alignment signal from the detector, the alignment signal comprising a first component received during illumination of a first alignment mark segment only, a second component received during illumination of a second alignment mark segment only, and a third component received during simultaneous illumination of both alignment mark segments; and determine the positions of the alignment mark segments using the first In an embodiment, there is provided a processor configured to: receive an alignment signal, the alignment signal comprising a first component received during illumination of a first alignment mark segment only, a second component received during illumination of a second alignment mark segment only, and a third component received during simultaneous illumination of both alignment mark segments; and determine the positions of the alignment mark segments using the first component, the second component and the third component of the alignment signal.

In an embodiment, there is provided a computer readable medium wherein a readable code is stored on the computer readable medium, the code causing use of a method described herein.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of determining the position of an alignment mark on a substrate, the alignment mark comprising a first segment and a second segment, the method comprising:
    illuminating the alignment mark with radiation, detecting radiation diffracted by the alignment mark and generating a resulting alignment signal, the alignment signal comprising a first component received during illumination of the first segment only, a second component received during illumination of the second segment only, and a third component received during simultaneous illumination of both first and second segments; and
    determining the positions of the first and second segments using the first component, the second component and the third component of the alignment signal, the determining including deconvolvinq the third component of the alignment signal.

2. The method of claim 1, wherein the determining uses the results of a calibration measurement on a calibration mark having known characteristics to produce a calibration alignment signal from which a relationship between the alignment signal and the positions of the first and second segments may be determined.

3. The method of claim 2, wherein the determining includes fitting the calibration alignment signal to the alignment signal.

4. The method of claim 2, wherein the calibration alignment signal is used to deconvolve the third component of the alignment signal.

5. The method of claim 1, wherein the deconvolution is based upon knowledge of a size and shape of a profile of the radiation and knowledge of the first and second components.

6. The method of claim 1, wherein the determining involves separating the alignment signal into multiple parts and analyzing each part to extract local phase information from the alignment signal.

7. The method of claim 6, wherein analyzing each part of the alignment signal includes fitting one or more functions to each part of the alignment signal.

8. The method of claim 1, wherein the determining includes performing a Hilbert transform on the alignment signal to produce a complex alignment signal.

9. The method of claim 1, wherein the first segment comprises a sub-segmented grating having a first known component of positional offset between a center of its at-resolution features and a center of its space regions and the second segment comprises a sub-segmented grating having a second known component of positional offset between a center of its at-resolution features and a center of its space regions, the first known component of positional offset being different to the second known component of positional offset.

10. The method of any preceding claim 1, wherein the substrate comprises first and second target portions, and wherein the first segment is located in the first target portion and the second segment is located in the second target portion such that the alignment mark is a concatenated intrafield alignment mark.

11. An alignment system comprising a detector and a processor, the processor configured to at least:
receive an alignment signal from the detector, the alignment signal comprising a first component received during illumination of a first alignment mark segment only, a second component received during illumination of a second alignment mark segment only, and a third component received during simultaneous illumination of both first and second alignment mark segments; and
determine the positions of the first and second alignment mark segments using the first component, the second component and the third component of the alignment signal, the determination including deconvolving the third component of the alignment signal.

12. A lithographic apparatus comprising:
a substrate table configured to hold a substrate;
a projection system configured to project a radiation beam onto a target portion of a substrate held by the substrate table; and
the alignment system according to claim 11.

13. A non-transitory computer readable medium comprising readable code stored thereon, the code, when executed, configured to cause a processor system to at least:
receive an alignment signal, the alignment signal comprising a first component received during illumination of a first alignment mark segment only, a second component received during illumination of a second alignment mark segment only, and a third component received during simultaneous illumination of both first and second alignment mark segments; and
determine the positions of the first and second alignment mark segments using the first component, the second component and the third component of the alignment signal, the determination including deconvolving the third component of the alignment signal.

14. The computer readable medium of claim 13, wherein the instructions configured to determine the positions of the first and second alignment mark segments are further configured to determine the positions using the results of a calibration measurement on a calibration mark having known characteristics to produce a calibration alignment signal from which a relationship between the alignment signal and the positions of the first and second alignment mark segments may be determined.

15. The computer readable medium of claim 14, wherein the instructions are further configured to use the calibration alignment signal to deconvolve the third component of the alignment signal.

16. The computer readable medium of claim 13, wherein the instructions are further configured to perform the deconvolution based upon knowledge of a size and shape of a profile of the radiation and knowledge of the first and second components.

17. The computer readable medium of claim 13, wherein the instructions configured to determine the positions of the first and second alignment mark segments are further configured to separate the alignment signal into multiple parts and analyze each part to extract local phase information from the alignment signal.

18. The computer readable medium of claim 17, wherein the instructions configured to analyze each part are further configured to fit one or more functions to each part of the alignment signal.

19. The computer readable medium of claim 13, wherein the instructions configured to determine the positions of the first and second alignment mark segments are further configured to perform a Hilbert transform on the alignment signal to produce a complex alignment signal.

20. The computer readable medium of claim 13, wherein the first segment comprises a sub-segmented grating having a first known component of positional offset between a center of its at-resolution features and a center of its space regions and the second segment comprises a sub-segmented grating having a second known component of positional offset between a center of its at-resolution features and a center of its space regions, the first known component of positional offset being different to the second known component of positional offset.

* * * * *